United States Patent
Baker et al.

(12) 
(10) Patent No.: US 6,299,272 B1
(45) Date of Patent: Oct. 9, 2001

(54) PULSE WIDTH MODULATION FOR CORRECTING NON-UNIFORMITY OF ACOUSTIC INKJET PRINTHEAD

(75) Inventors: Lamar T. Baker, Manhattan Beach; Steven A. Buhler, Sunnyvale; Abdul M. Elhatem, Redondo Beach; Scott A. Elrod, La Honda; Babur B. Hadimioglu, Mountain View; Jaime Lerma, Murrieta; Mostafa R. Yazdy, Los Angeles, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/428,823

(22) Filed: Oct. 28, 1999

(51) Int. Cl.[7] ........................ B41J 29/38
(52) U.S. Cl. ............................. 347/10
(58) Field of Search .................. 347/5, 9, 10, 11, 347/14, 48, 49

(56) References Cited

U.S. PATENT DOCUMENTS

| | | | |
|---|---|---|---|
| 4,087,825 | * 5/1978 | Chen et al. | 347/15 |
| 4,672,398 | * 6/1987 | Kuwabara et al. | 347/48 |
| 4,982,199 | * 1/1991 | Dunn | 347/15 |
| 5,107,276 | * 4/1992 | Kneezel et al. | 347/60 |

* cited by examiner

*Primary Examiner*—Anh T. N. Vo
(74) *Attorney, Agent, or Firm*—Fariba Rad; William Pope (57) ABSTRACT

An acoustic inkjet printhead utilizes a pulse width modulation to control droplet size or ejection velocity. An individual control pulse controls the duration and the time a RF signal is applied to each transducer. To modify the RF signal of each transducer, the pulse width of each control signal can be modified according to a predetermined correction data. The rising edge of the control data is delayed according to the correction data while the falling edge is kept the same.

10 Claims, 11 Drawing Sheets

PULSE WIDTH MODULATION FOR CORRECTING NON-UNIFORMITY OF ACOUSTIC INKJET PRINTHEAD

BACKGROUND OF THE INVENTION

This invention relates to correcting non-uniformity of size or ejection velocity of each individual droplet of acoustic inkjet printheads and more particularly to an acoustic inkjet printhead where the RF signal delivered to each transducer is individually controlled to provide a desired droplet size or ejection velocity.

Figure 1:
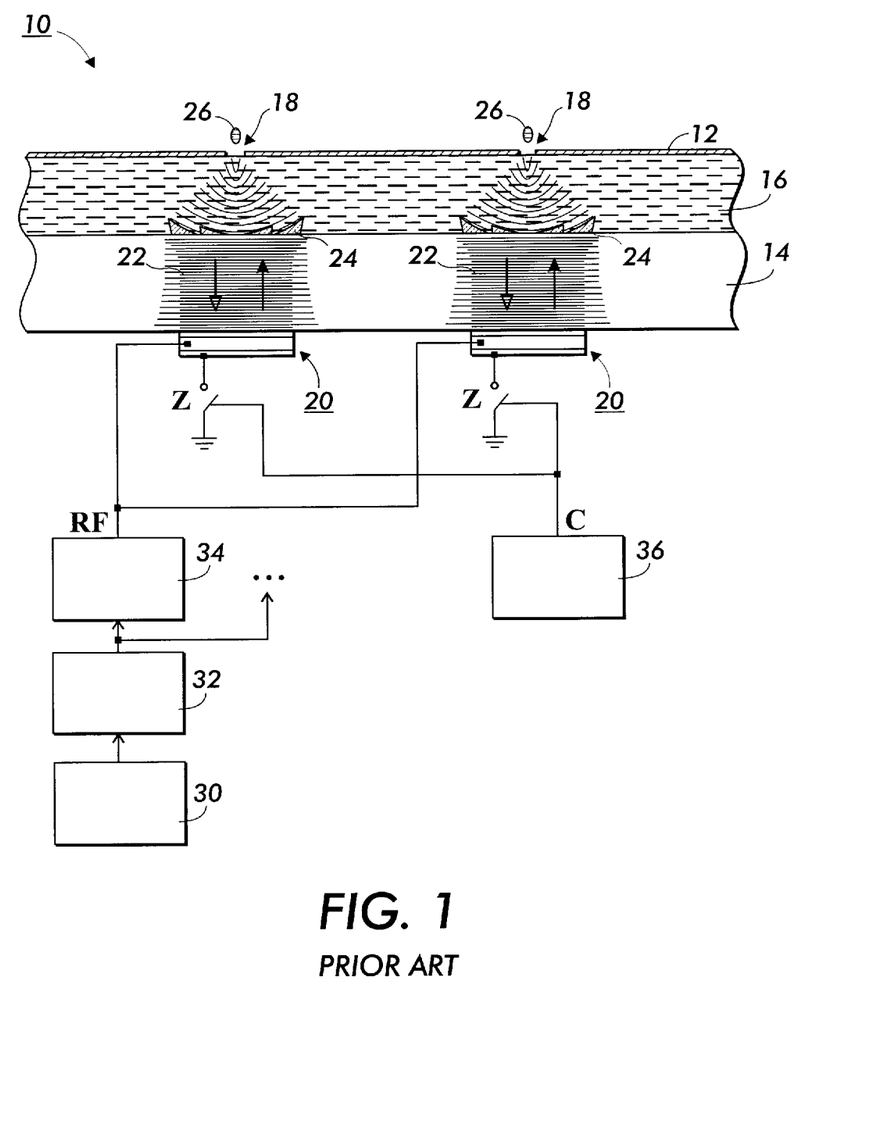
FIG. 1 shows a portion of a prior art acoustic inkjet printhead.

Referring to FIG. 1, there is shown a portion of a prior art acoustic inkjet printhead 10. Printhead 10 has a liquid level control structure 12 which captures an ink layer 16 over a glass substrate 14. Liquid level control structure 12 has a plurality of apertures 18 each of which is dedicated to a single acoustic ejector. Under the glass substrate, there is a plurality of piezo-electric transducers 20. For the purpose of simplicity, hereinafter, the "piezo-electric transducer" is referred to as "transducer." Each transducer 20 is dedicated to one aperture 18 and is located directly across its respective aperture 18. Once each transducer 20 is activated, it will oscillate and generate acoustic waves 22 which travel within the glass substrate 14 toward the ink 16.

Over the glass substrate 14, there is a plurality of Fresnel lenses 24, each of which corresponds to one of the transducers 20 and is located across from its respective transducer 20. The Fresnel lenses 24 receive the acoustic waves 22 from the transducers 20 and focus the acoustic waves onto the liquid surface in their respective apertures 18. The focused waves 22 cause the ink to be ejected from the apertures as droplets 26.

Oscillator 30 generates a RF signal and sends it to a RF Amplifier 32 to be amplified. The amplified RF signal is sent to several RF power switches 34. Each output of each power switch 34 is distributed between the plurality of transducers 20 where each transducer 20 is grounded through its individual switch Z. Switches Z control the time and duration of the RF signal applied to each transducer 20. Once each switch Z is closed, the RF signal flows into the respective transducer 20 and once the switch is opened, the flow of the RF signal into the transducer 20 will be significantly reduced. The time each switch Z is closed determines the duration of the RF signal applied to the transducers. All switches Z receive the same control signal C from a switch driver circuit 36. As a result, all switches Z, that are supposed to close, close at the same time and all the closed switches Z open at the same time. The electrical connection shown in FIG. 1 is designed to deliver a RF signal with the same power to each transducer 20. However, due to the variations in the focusing characteristics of different transducers 20, droplets 26 ejected from different apertures 18 might have different sizes.

Non-uniformity of droplet size 18 creates different size pixels which can be observed as variation of the thickness of a line. However, non-uniformity of ejection velocity causes pixels not to align on a straight line. Since the paper is moving, in order to have a straight line, all the droplets have to be ejected at the same time to strike the paper at the same time. If a droplet is ejected before or after the intended time, the pixel on the paper will be above or below the intended line respectively. Non uniformity of the droplet size and velocity are two problems of the prior art acoustic ink jet printheads.

It is an object of this invention to provide a driver circuitry to control the size or ejection velocity of droplets of acoustic inkjet printheads.

SUMMARY OF THE INVENTION

In accordance with one aspect of this invention, a method of correcting non-uniformity of droplet size or ejection velocity by pulse width modulation comprises the steps of receiving a pulse with a first pulse edge and a second pulse edge and delaying the first pulse edge of said pulse according to a plurality of predetermined delay data to create a plurality of delayed first pulse edges. Subsequently, sending out each delayed first pulse edge with the received second pulse edge of the pulse as the first pulse edge and second pulse edge of a control pulse to create a plurality of control pulses with different pulse widths.

In accordance with another aspect of this invention, an apparatus for correcting non-uniformity of droplet size or ejection velocity by pulse width modulation comprises a delaying means. The delaying means receives a pulse and creates a plurality of control pulses. The received pulse has a first pulse edge and a second pulse edge. A lookup table stores an individual delay data for each of the plurality of control pulses. The delaying means is in communication with the lookup table to receive the plurality of delay data. The delaying means is responsive to the delay data from the lookup table to delay only the first pulse edge of the pulse according to each of the delay data to create a plurality of delayed first pulse edges. The delaying means sends out each of the plurality of delayed first pulse edges in combination with the received second pulse edge of the pulse as the first pulse and second pulse edges of a control pulse to create a plurality of control pulses with different pulse widths.

DESCRIPTION OF THE PREFERRED EMBODIMENT

Figure 2:
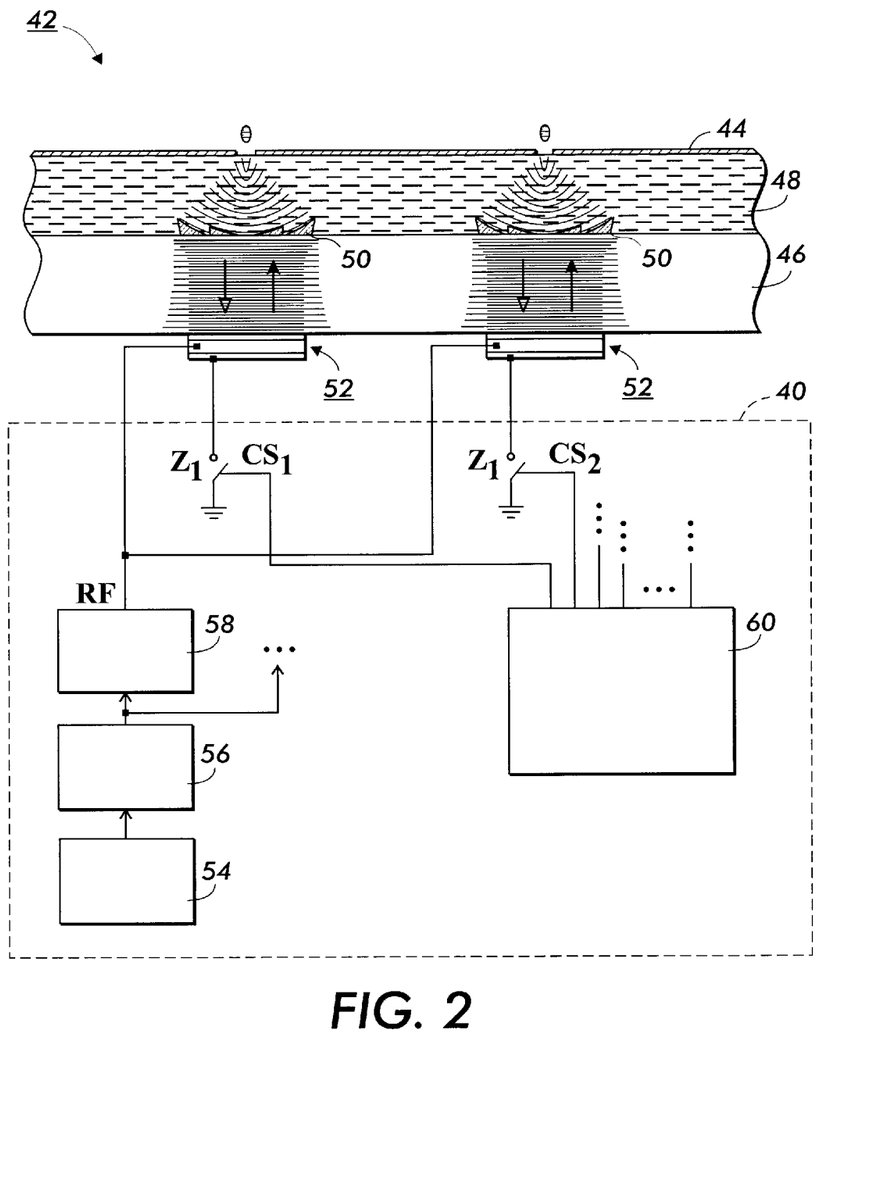
FIG. 2 shows the acoustic inkjet driver circuit of this invention along with its associated printhead.

Referring to FIG. 2, there is shown the acoustic inkjet driver circuit 40 of this invention along with its associated printhead 42. Printhead 42 comprises a liquid level control structure 44, a sheet of glass substrate 46, ink 48 over the glass substrate 46, a plurality of Fresnel lenses 50 over the glass substrate 46 within the ink 48, and a plurality of transducers 52 under the glass substrate 46.

The acoustic inkjet driver circuit 40 supplies a RF signal to all transducers 52 where each transducer 52 is grounded through an individual switch $Z_1$. In FIG. 2, a RF power source 54 generates and sends a RF signal to the plurality of transducers 52 through an amplifier 56 and a plurality of power switches 58. A control block 60, within the acoustic inkjet driver circuit 40, has an individual connection ($CS_1$, $CS_2$, . . . ) to each switch $Z_1$ to individually control (activate or inactivate) switches $Z_1$. Once activated, each switch $Z_1$ causes the RF signal to flow into its respective transducer 52 and once inactivated, the flow will be significantly reduced. Control block 60 is capable of modifying the RF signal applied to each transducer 52 to generate a droplet with a desired size or velocity.

In this invention, the duration of the RF signal applied to each transducer 52 is modified according to the correction data for each transducer to produce a desired spot size or velocity. This is accomplished by controlling the duration of the time that each switch $Z_1$ is active through the control block 60.

The activation time (rising edge of control signal) of each switch $Z_1$ is customized to the requirement of its respective transducer 52. However, all switches $Z_1$ will be inactivated (falling edge of control signal) by the system at the same time. In other words, switches $Z_1$ will be activated at different times, but inactivated at the same time. This causes each transducer 52 to receive the RF signal at a different time for a different duration.

It should be noted the same control can be accomplished by activating all switches $Z_1$ at the same time and closing them at different times. However, for the purpose of discussion, activating switches at different times and inactivating at the same time is selected.

Figure 3:
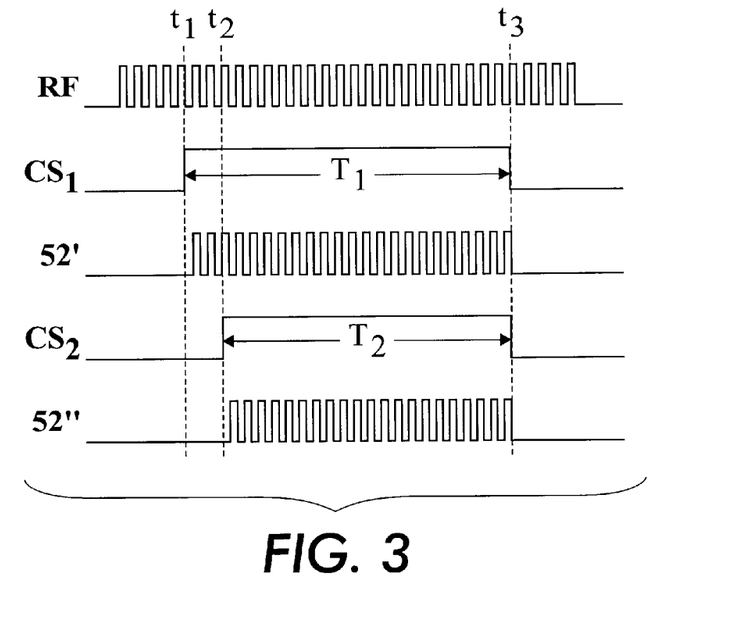
FIG. 3 shows an RF signal and control signals of two transducers and the RF signals applied to each transducer.
Figure 4:
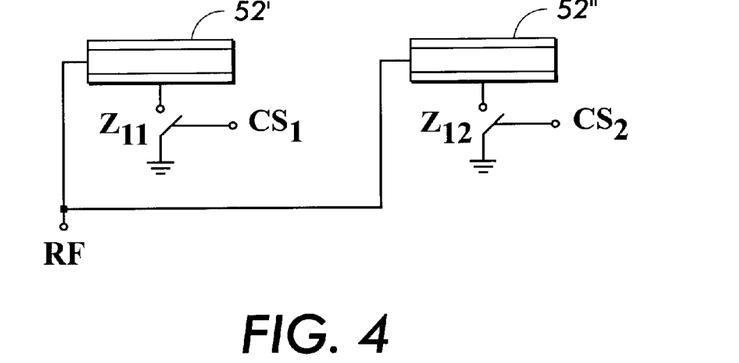
FIG. 4 shows the two transducers relevant to FIG. 3.

For example, referring to FIGS. 3 and 4 an identical RF pulse is delivered to both transducers 52' and 52", but switch $Z_{11}$ receives a control signal $CS_1$ at time $t_1$ when switch $Z_{12}$ receives a control signal $CS_2$ at time $t_2$. Both switches $Z_{11}$ and $Z_{12}$ are deactivated at time $t_3$. This will cause transducer 52' to receive the RF signal for duration of $T_1$ and transducer 52" to receive the RF signal for duration of $T_2$.

Figure 5:
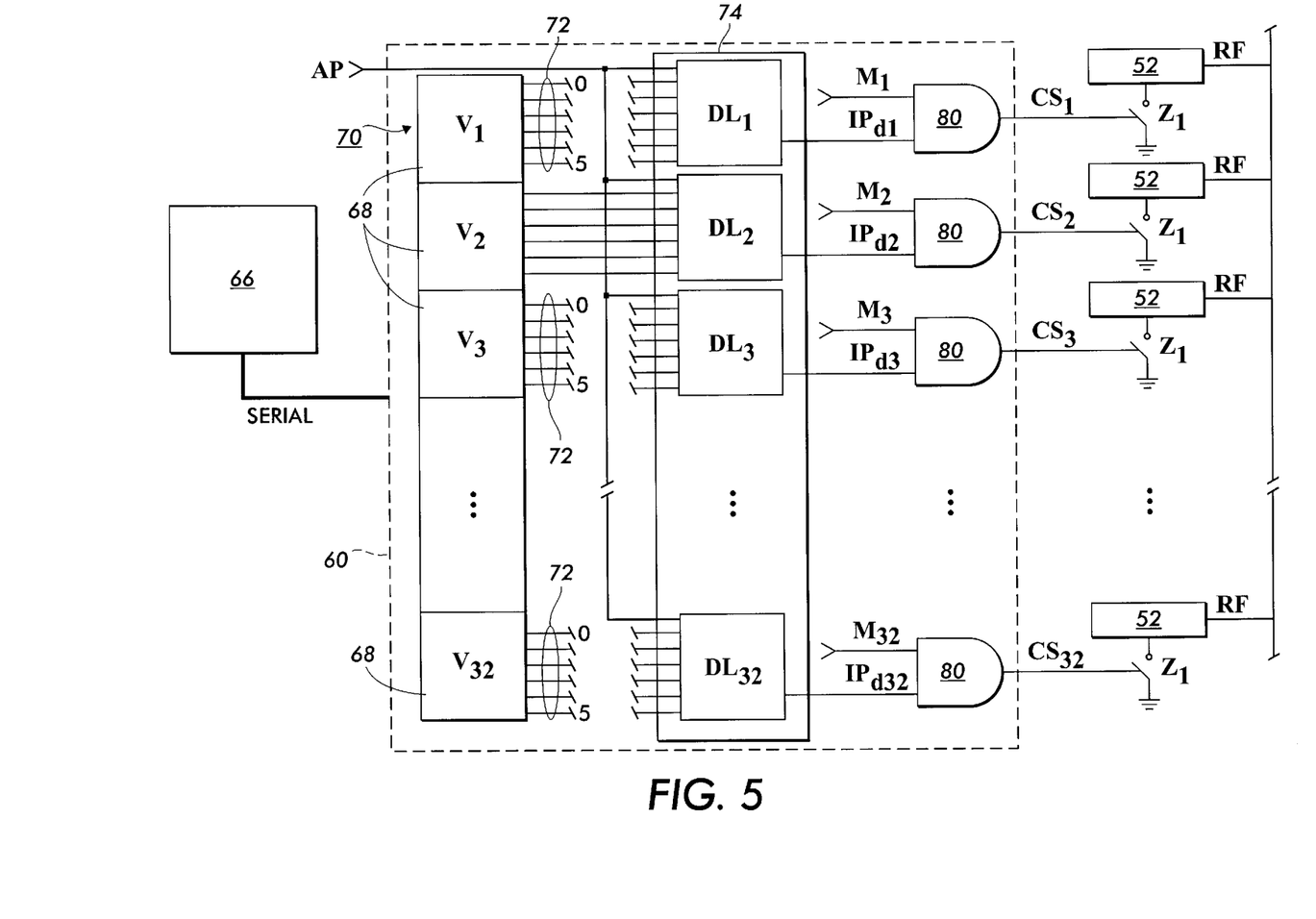
FIG. 5 shows a block diagram of the control block of FIG. 2 which receives a serial data from a look up table.

Referring to FIG. 5, there is shown a block diagram of the control block 60 of FIG. 2 which receives a serial data from a look up table 66. Referring to both FIGS. 2 and 5, the look up table 66 contains the correction data for the width of the control signal of each switch $Z_1$. The correction data is a number (delay value) $V_1$–$V_3$2 represented by six bits which is sent out serially. Control block 60 receives the serial data from the look up table 66 and places each six consecutive bits, which represent one correction data, in an addressable location 68 of a RAM 70. RAM 70 has 32 addressable locations 68 to hold correction data for 32 transducers 52 of one column of a two dimensional array of transducers 52.

It should be noted that the number of addressable locations of the RAM 70 can be modified to accommodate any number of transducers. Therefore, the concept of this invention should not be limited to the number of transducers in a column or a row. The concept can be applied to any number of transducers on a printhead.

RAM 70 has six outputs 72 for each addressable location 68. When one addressable location 68 of RAM 70 is activated, the six bit data stored in that location is sent out to the six outputs 72 to provide as a parallel output data. The parallel output data 72 of each location 68 is sent to the pulse width modulator (PWM) block 74.

The PWM 74 receives a system activation pulse as input pulse IP from the system (printer). In the prior art design of FIG. 1, the rising edge of the input pulse IP is used to activate all switches. However, in this invention the rising edge of the input pulse IP is used to activate the PWM 74. By receiving the input pulse IP, the PWM block 74 takes the parallel output data 72 from all the locations 68 of the RAM 70. Each six bits 72 from each addressable location 68 is delivered to one of the blocks $DL_1$–$DL_{32}$. For the purpose of simplicity, only the connection of the outputs 72 of one of the addressable locations 68 to its respective block DL2 is shown. Each block $DL_1$–$DL_{32}$ receives the input pulse IP, reads the number represented by the six bits 72, and delays the rising edge of the input pulse IP according to the received number. However, when blocks $DL_1$–$DL_{32}$ receive the falling edge of the input pulse IP, they will be rested and their outputs will become zero. As a result, blocks $DL_1$–$DL_{32}$ delay the rising edge of the input pulse IP, but send out the falling edge of the input pulse IP without any delay. In this specification, delaying the rising edge without delaying the falling edge or visa versa is defined as pulse width modulation.

Each delayed input pulse $IP_{d1}$–$IP_{d32}$ is sent to an AND gate 80. Each AND gate 80 receives an individual selection signal $M_1$–$M_{32}$ which selects the activation of its respective switch $Z_1$. Once any one of the selection signals $M_1$–$M_{32}$ is high (1), then the respective AND gate 80 sends out the delayed pulse $IP_{d1}$–$IP_{d32}$ as a control pulse $CS_1$–$CS_{32}$ to their respective switches $Z_1$ .

The block diagram 60 modifies the time and duration of the RF signal applied to each transducer to provide a desired spot size for each droplet. Changing the duration of the RF signal also changes the energy applied to each transducer which causes the velocity of the ejection to change. If the printed lines have droplet size errors, a correction data can be created based on the droplet size errors. However, if the printed line has jagged pixels, then a correction data based on the ejection velocity error can be created. The disclosed embodiment of this invention can correct either the droplet size or the ejection velocity depending on if it receives correction data for droplet size or correction data for ejection velocity respectively. Therefore, the look up table 66 of FIG. 5 can either hold correction data for droplet size or correction data for ejection velocity.

Figure 6:
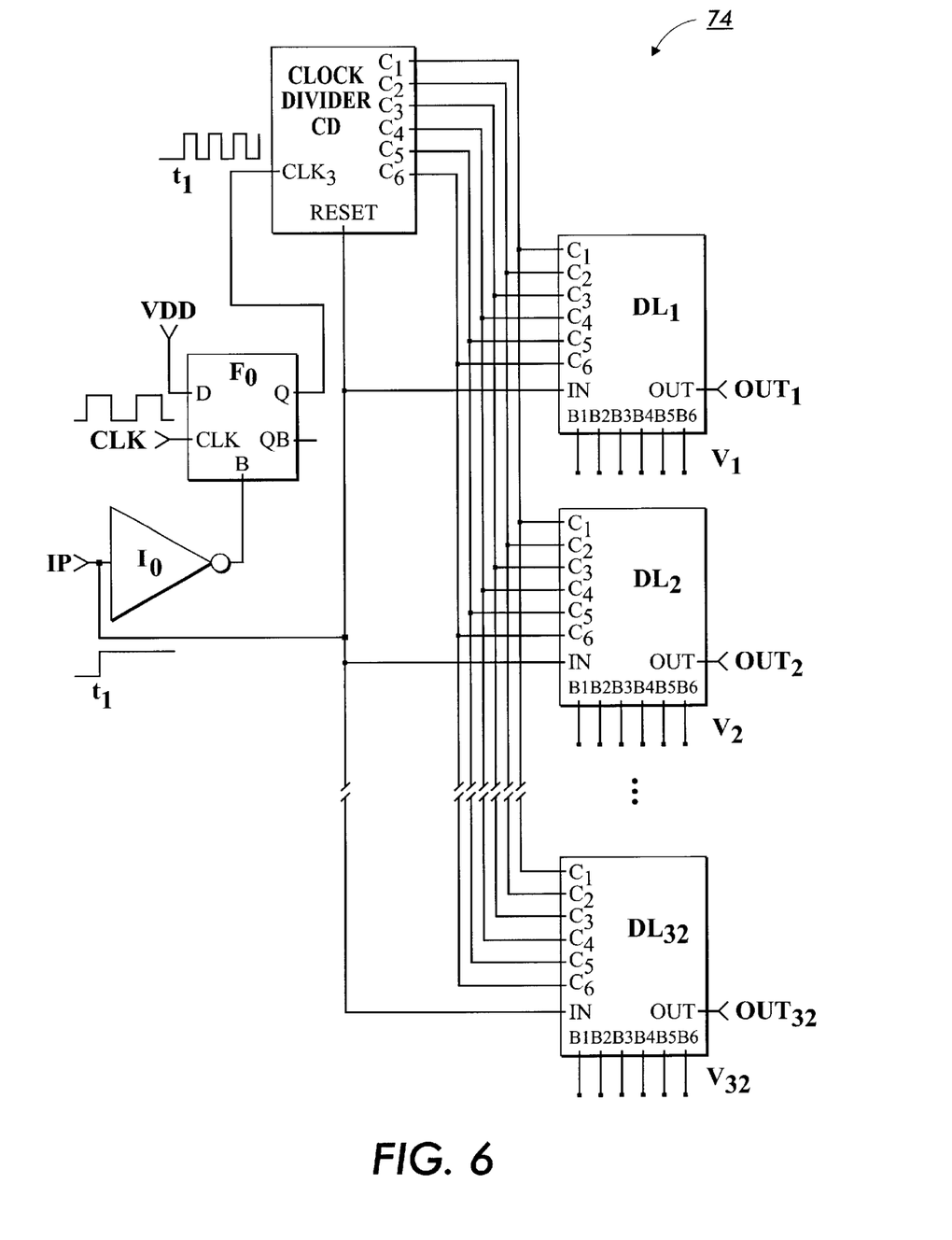
FIG. 6 shows a block diagram of the pulse width modulation block of FIG. 5.

Referring to FIG. 6, there is shown a detail block diagram PWM 74. In FIG. 6, a clock divider CD divides the system clock CLK and generates 6 clocks $C_1$, $C_2$, $C_3$, $C_4$, $C_5$, and $C_6$ with periods of T, 2T, 4T, 8T, 16T, and 32T and sends them to the delay logic blocks $DL_1$–$DL_{32}$ of different lines.

In order to prevent partial delay, in FIG. 6, flip flop $F_0$ is placed in the path of system clock CLK to the clock divider CD. The D input of flip flop $F_0$ is connected to VDD to continuously keep the D input of flip flop $F_0$ at high (1). The positive output (Q) of $F_0$ is connected to the clock divider CD. The input pulse which needs to be delayed, is connected to the Reset line of the $F_0$ through an inverter $I_0$. The clock input of flip flop $F_0$ receives the system clock CLK.

In operation, flip flop $F_0$ keeps the system clock CLK until it receives the rising edge of IP which inactivates the reset of flip flop $F_0$. Then, $F_0$ sends out the system clock as a synchronized clock $CLK_S$ to the CD block. Since $CLK_S$ is synchronized with the input pulse IP, the input pulse IP will receive full delays.

Figure 7:
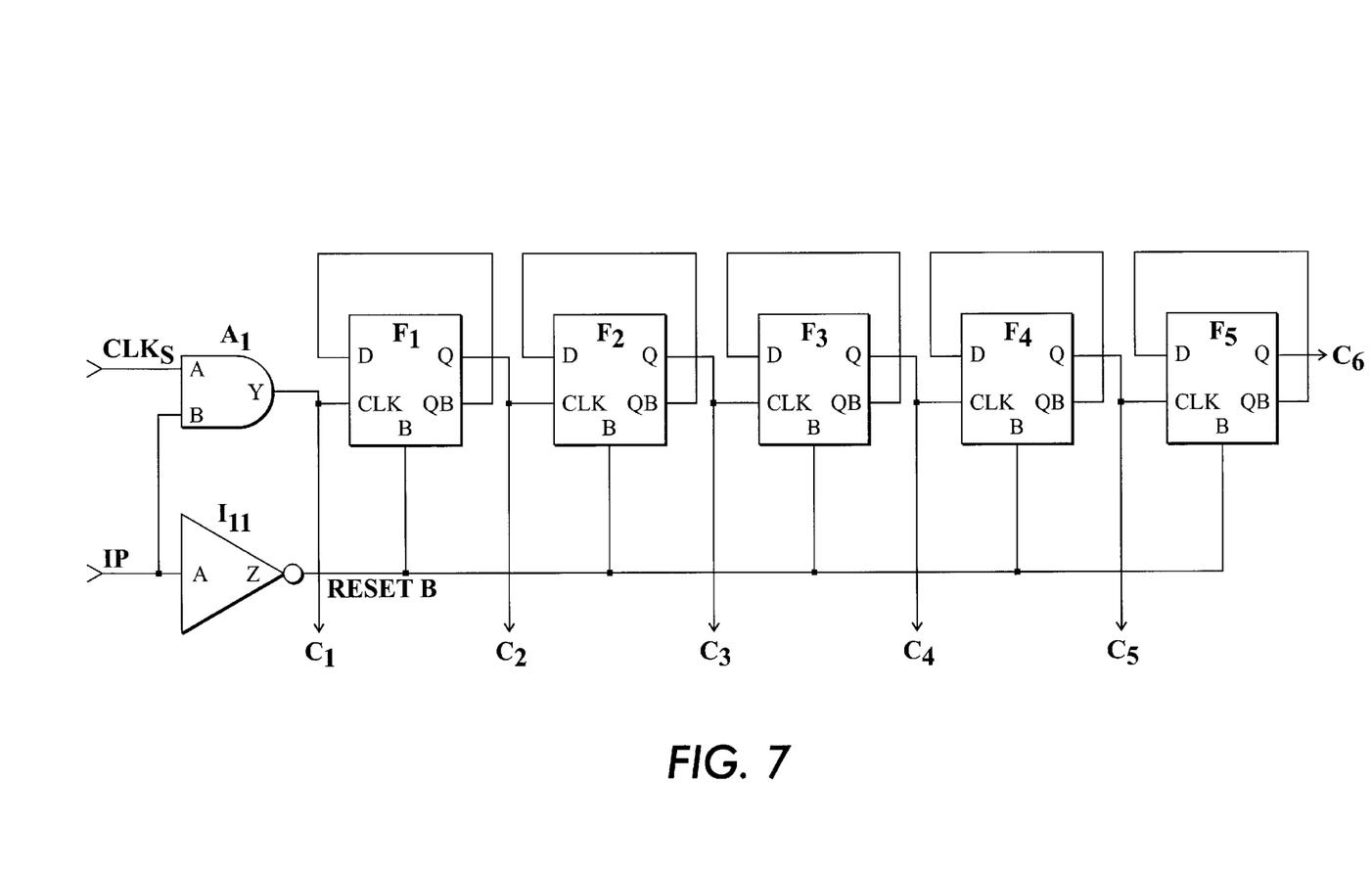
FIG. 7 shows a detail block diagram of the clock divider of FIG. 6.

Referring to FIG. 7, there is shown a detail block diagram of the clock divider CD of FIG. 6. In FIG. 7, the system reset input pulse IP is sent to the reset pin of flip flops $F_1$, $F_2$, $F_3$, $F_4$, and $F_5$ through inverter $I_{11}$. The synchronized system clock $CLK_S$ and the input pulse IP are sent to an AND gate $A_1$ to generate a resetable clock $C_1$ with the same period as the synchronized system clock CLKS. To divide clock $C_1$, five flip flops $F_1$, $F_2$, $F_3$, $F_4$, and $F_5$ are used. $C_1$ is sent to $F_1$ as a clock. The negative output (QB) of each one of the flip flops $F_1$, $F_2$, $F_3$, $F_4$, and $F_5$ is connected to its input. This configuration causes each flip flop $F_1$, $F_2$, $F_3$, $F_4$, and $F_5$ to divide its clock by 2. The positive output (Q) of each flip flop $F_1$, $F_2$, $F_3$, $F_4$, and $F_5$ is connected to the clock of the following flip flop. In addition, the positive output of flip flops $F_1$, $F_2$, $F_3$, $F_4$, and $F_5$ are sent out as clocks $C_2$, $C_3$, $C_4$, $C_5$, and $C_6$ respectively.

Figure 8:
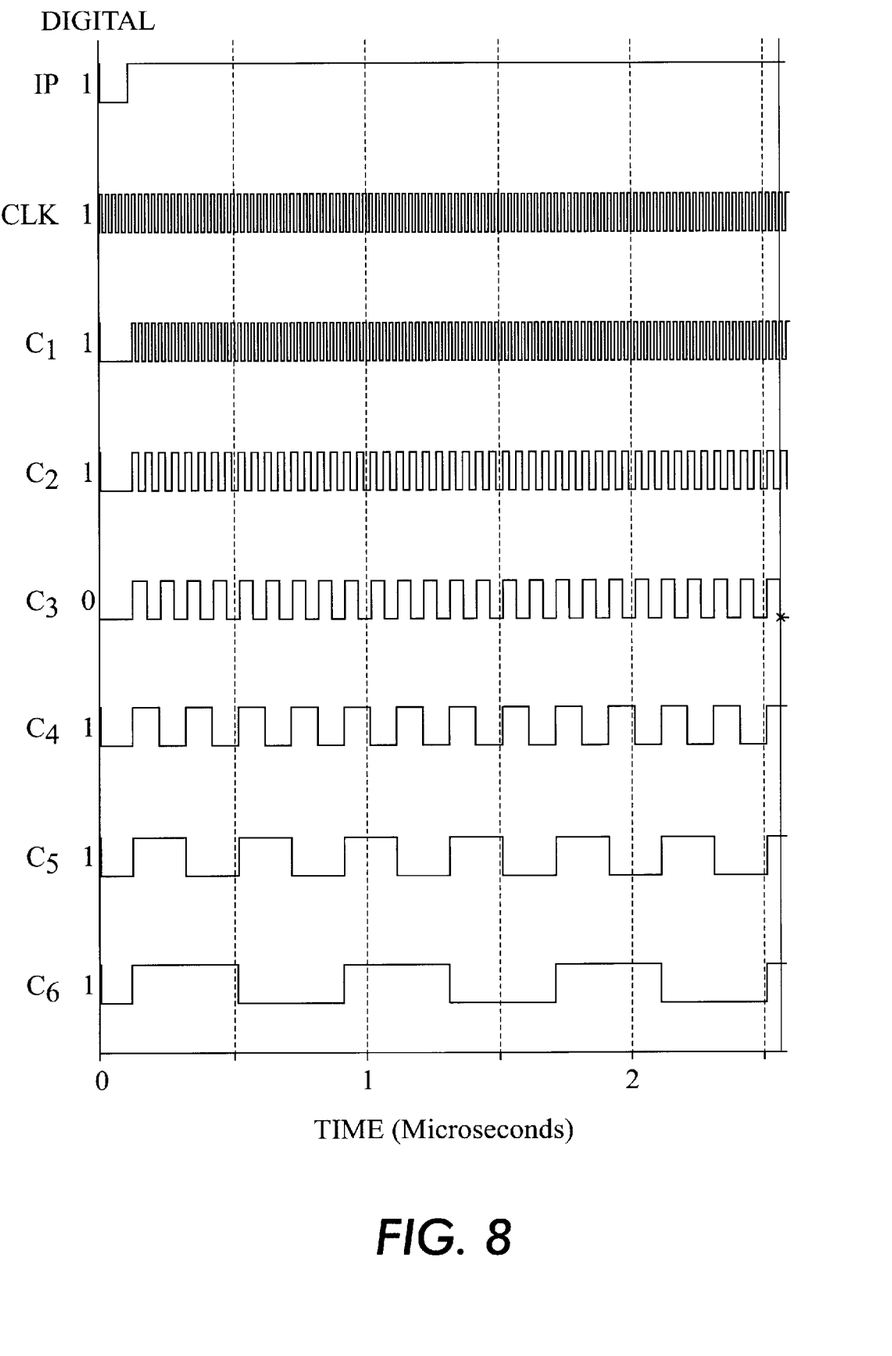
FIG. 8 shows different periods of clocks of FIG. 6.

Since each flip flop $F_1$, $F_2$, $F_3$, $F_4$, and $F_5$ divides its clock by 2 and sends it out on its positive output, $C_2$ has a period twice as its input clock. Since the period of clock $C_1$ is equal to the period T of the synchronized system clock CLKs, the period of clock $C_2$ is 2T. In the same manner, the periods of clocks $C_3$, $C_4$, $C_5$, and $C_6$ are 4T, 8T, 16T, and 32T as shown in FIG. 8.

Referring back to FIG. 6, clocks $C_1$, $C_2$, $C_3$, $C_4$, $C_5$, and $C_6$ are sent to all delay bocks $DL_1$–$DL3_2$ where each delay block selects a combination of the clocks $C_1$, $C_2$, $C_3$, $C_4$, $C_5$, and $C_6$ to create a required delay. Each delay block $DL_1$–$DL_{32}$ receives the input pulse IP and a six bit delay value $V_1$–$V_{32}$ via the outputs 72 of FIG. 5. By using clocks $C_1$, $C_2$, $C_3$, $C_4$, $C_5$, and $C_6$, each delay block $DL_1$–$DL_{32}$ delays the input pulse IP according to its respective delay value $V_1$–$V_{32}$ and sends it out on its output $OUT_1$–$OUT_{32}$ respectively.

Figure 9:
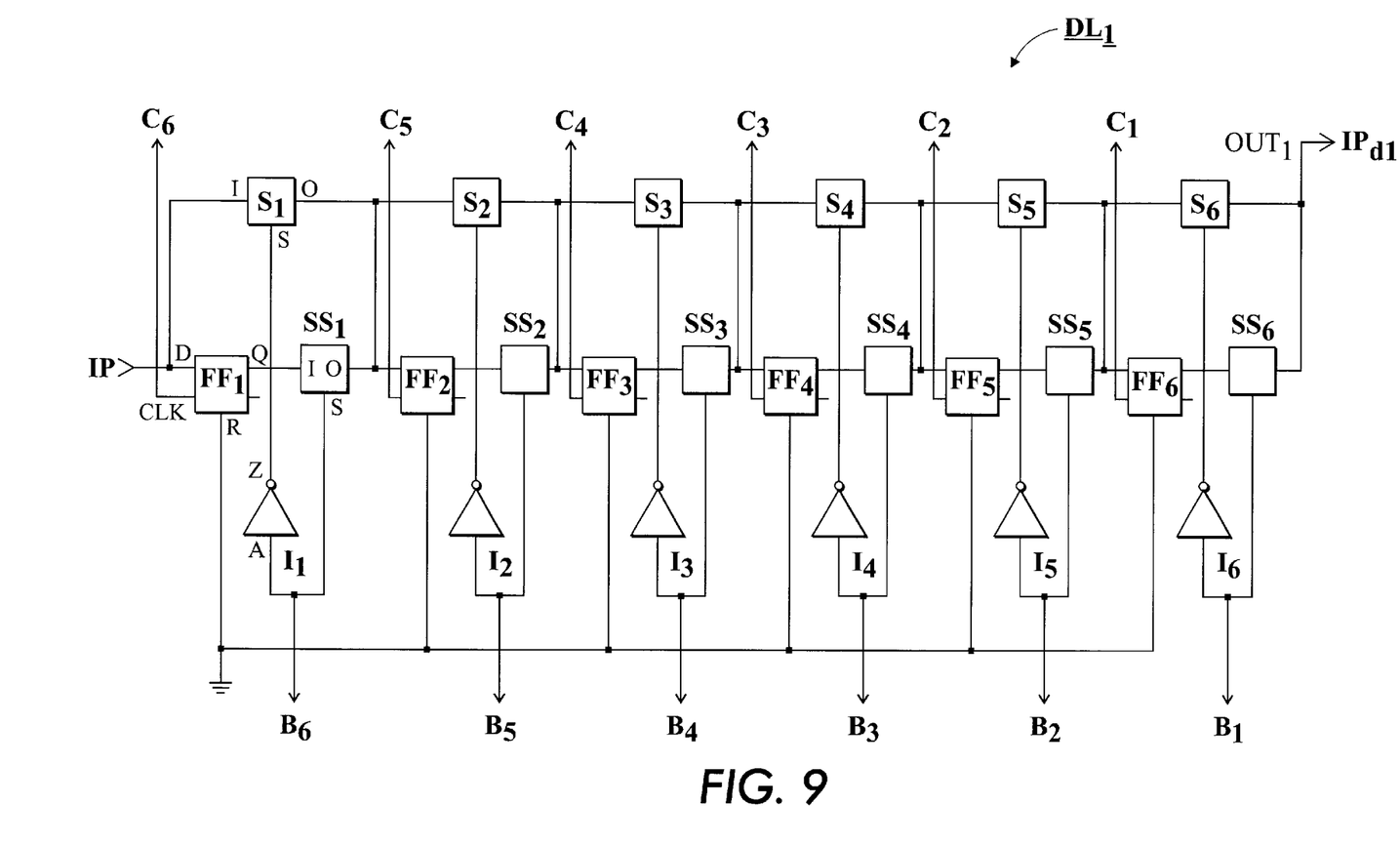
FIG. 9 shows a logic diagram of one of the delay blocks.

Referring To FIG. 9, there is shown a logic diagram one of the delay block $DL_1$. It should be noted that the delay blocks $DL_2$–$DL_{32}$ are identical to $DL_1$. In delay block $DL_1$, there are six D flip flops $FF_1$, $FF_2$, $FF_3$, $FF_4$, $FF_5$, $FF_6$. The clock inputs of the flip flops $FF_1$, $FF_2$, $FF_3$, $FF_4$, $FF_5$, $FF_6$ are connected to the clocks $C_6$, $C_5$, $C_4$, $C_3$, $C_2$, and $C_1$ respectively.

The positive output of each flip flop $FF_1$, $FF_2$, $FF_3$, $FF_4$, and $FF_5$ is connected to the input of the following flip flop through switches $SS_1$, $SS_2$, $SS_3$, $SS_4$, and $SS_5$ respectively. The positive output of flip flop $FF_6$ is connected to the output $OUT_1$ through switch $SS_6$. The output OUT1 provides the $IP_{d1}$ of FIG. 5. The input of each flip flop $FF_1$, $FF_2$, $FF_3$, $FF_4$, $FF_5$, $FF_6$ is connected to the input of the following flip flop through switches $S_1$, $S_2$, $S_3$, $S_4$, $S_5$, and $S_6$ respectively.

Each delay block $DL_1$–$DL_{32}$ of FIG. 6 receives a separate delay value through $V_1$–$V_{32}$ respectively. Each $V_1$–$V_{32}$ has six bits $B_1$, $B_2$, $B_3$, $B_4$, $B_5$, and $B_6$ which deliver a number between 0 to 63. $B_1$, $B_2$, $B_3$, $B_4$, $B_5$, and $B_6$ are directly connected to the control pins of switches $SS_1$, $SS_2$, $SS_3$, $SS_4$, $SS_5$, and $SS_6$ respectively and connected to the control pins of switches $S_1$, $S_2$, $S_3$, $S_4$, $S_5$, and $S_6$ through inverters $I_1$, $I_2$, $I_3$, $I_4$, $I_5$, and $I_6$ respectively.

In FIG. 9, every time one of the bits $B_6$, $B_5$, $B_4$, $B_3$, $B_2$, and $B_1$ is high (1), its respective switch $SS_1$, $SS_2$, $SS_3$, $SS_4$, $SS_5$, and $SS_6$ closes. For example, if $B_4$ is high (1) switch $SS_3$ closes and connects the positive output of $FF_3$ to the input of $FF_4$. However, every time one of the bits $B_6$, $B_5$, $B_4$, $B_3$, $B_2$, and $B_1$ is low (0), its respective switch $S_1$, $S_2$, $S_3$, $S_4$, $S_5$, and $S_6$ closes. For example, if $B_4$ is low (0) switch $S_3$ closes and connects the input of $FF_3$ to the input of $FF_4$. In other words, when one of the bits $B_6$, $B_5$, $B_4$, $B_3$, $B_2$, and $B_1$ is high (1), the output of the previous flip flop is delivered to the input of the following flip flop, but if it is low (0), the previous flip flop is by passed and its input is delivered to the input of the next flip flop.

With the configuration of FIG. 9, the high (1) bits $B_6$, $B_5$, $B_4$, $B_3$, $B_2$, and $B_1$ select the proper delay. For example, if the six bits $B_6$, $B_5$, $B_4$, $B_3$, $B_2$, and $B_1$ represent 100011, it means 32+2+1=35 delay is needed. Since $B_6$ is (1), switch $SS_1$ closes and flip flop $FF_1$ becomes active. Therefore, the input of flip flop $FF_1$ is delayed by 32T since $FF_1$ is clocked by clock $C_6$ which has a clock cycle of 32T. It should be noted that the input of the flip flop $FF_1$ is the input pulse IP that has to be delayed. Since, bits $B_5$, $B_4$, and $B_3$ are zero, switches $S_2$, $S_3$, and $S_4$ close, by pass flip flops $FF_2$, $FF_3$, and $FF_4$, and deliver the output of flip flop $FF_1$ to the input of $FF_5$.

Figure 10:
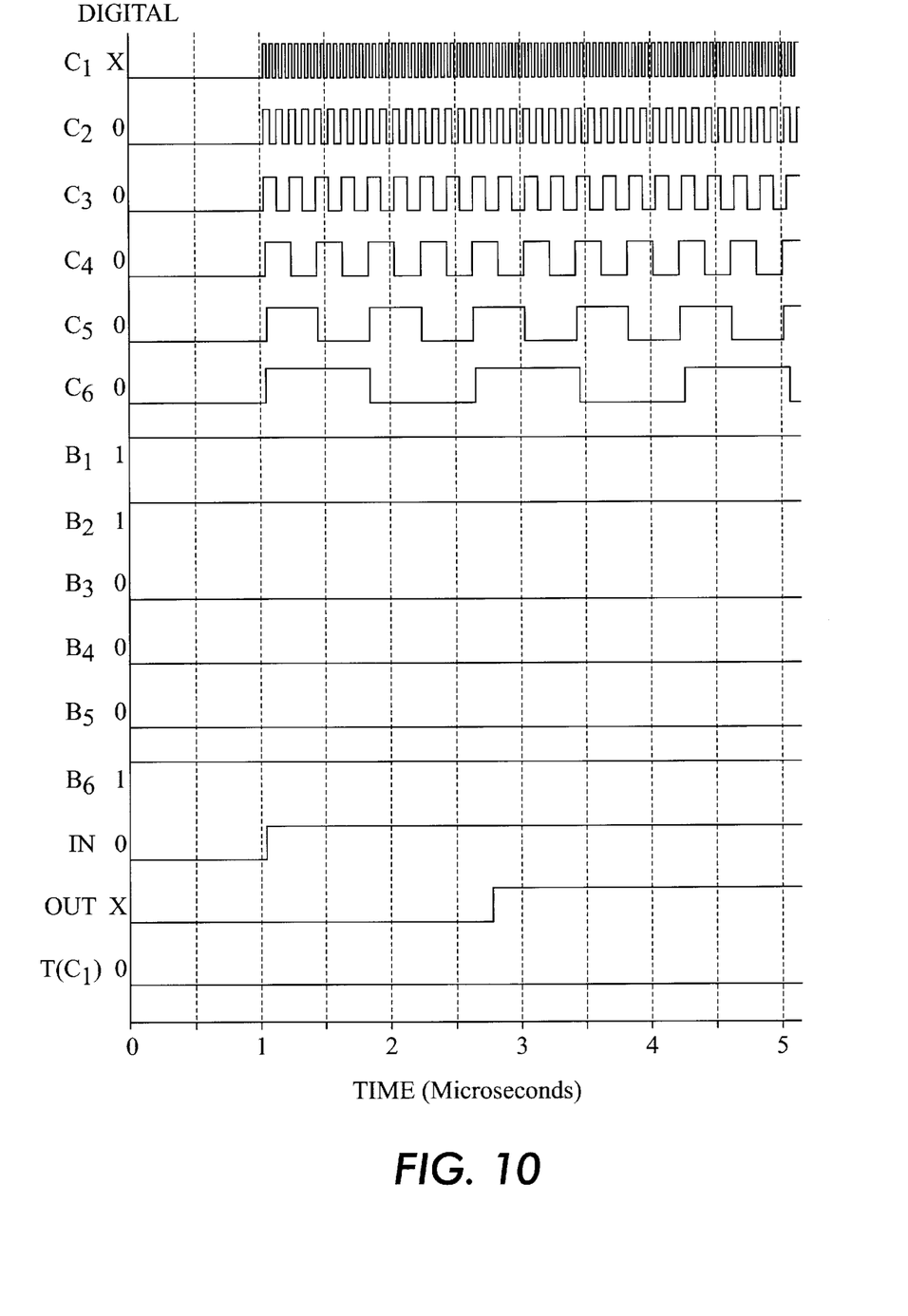
FIG. 10 shows the signals of FIG. 9 for a delay of 35T.

Since bits $B_2$ and $B_1$ are high (1), both switches $SS_5$ and $SS_6$ close and activate flip flops $FF_5$ and FF6. Since flip flop $FF_5$ receives clock $C_2$, it delays its input (output of $FF_1$ which is delayed by 32T) by 2T. Therefore, the output of flip flop $FF_5$ is delayed by 32T+2T=34T. Flip flop $FF_6$ uses clock $C_1$ which has a delay of T. Subsequently, flip flop $FF_6$ delays the output of $FF_5$ by T. Therefore the output of flip flop $FF_6$ which through switch $SS_6$ is connected to the $OUT_1$ provides a signal with 35T delay. The result is shown in FIG. 10.

At the power on, the outputs of the flip flops $FF_1$, $FF_2$, $FF_3$, $FF_4$, $FF_5$, and $FF_6$ can be at don't care (unknown) state. In order to prevent any error in the delay circuit, flip flops $FF_1$, $FF_2$, $FF_3$, $FF_4$, $FF_5$, and $FF_6$ have to receive a reset.

Figure 11:
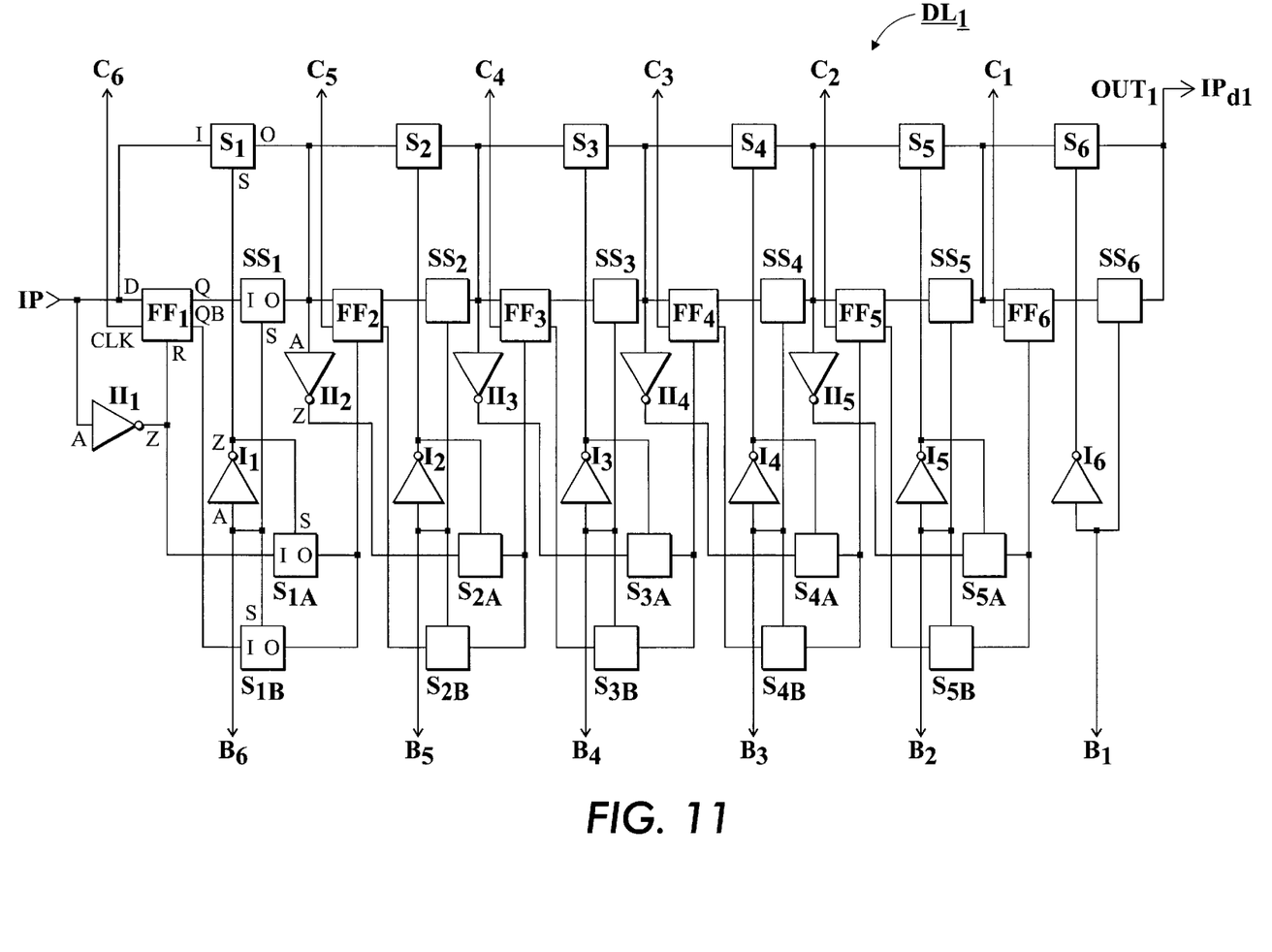
FIG. 11 shows the logic diagram of FIG. 9 with the addition of reset connections.

Referring to FIG. 11, there is shown the logic diagram of FIG. 9 with the addition of reset connections. Each flip flop $FF_2$, $FF_3$, $FF_4$, $FF_5$, and $FF_6$ receives a Reset signal from one of two switches ($S_{1A}$ and $S_{1B}$), ($S_{2A}$ and $S_{2B}$), ($S_{3A}$ and $S_{3B}$), ($S_{4A}$ and $S_{4B}$), and ($S_{5A}$ and $S^{5B}$) respectively. The control pins of switches $S_{1B}$, $S_{2B}$, $S_{3B}$, $S_{4B}$, and $S^{5B}$ are connected to $B_6$, $B_5$, $B_4$, $B_3$, and $B_2$ respectively. However, the control pins of switches $S_{1A}$, $S_{2A}$, $S_{3A}$, $S_{4A}$, and $S_{5A}$ are connected to $B_6$, $B_5$, $B_4$, $B_3$, and $B_2$ through inverters $I_1$, $I_2$, $I_3$, $I_4$, and $I_5$ respectively. The negative output (QB) of flip flops $FF_1$, $FF_2$, $FF_3$, $FF_4$, and $FF_5$ are connected to the reset pin of flip flops $FF_2$, $FF_3$, $FF_4$, $FF_5$, and $FF_6$ through switches $S_{1B}$, $S_{2B}$, $S_{3B}$, $S_{4B}$, and $S_{5B}$. Furthermore, the input of flip flops $FF_1$, $FF_2$, $FF_3$, $FF_4$, and $FF_5$ are connected to the reset pin of flip flops $FF_2$, $FF_3$, $FF_4$, $FF_5$, and $FF_6$ through inverters and switches ($II_1$ and $S_{1A}$), ($II_2$ and $S_{2A}$), ($II_3$ and $S_{3A}$), ($II_4$ and $S_{4A}$), and ($II_5$ and $S_{5A}$) respectively. Flip flop $FF_1$ is reset by the input pulse IP through inverter $II_1$.

At the power on, when the input pulse IP is low (0), if a flip flop becomes active for example $FF_1$, the input pulse IP (0) will be sent to the positive output (Q). Therefore, the output (QB) becomes (1) and resets the following flip flop $FF_2$ through $S_{1B}$. Every time a flip flop is by passed for example $FF_1$, then its input (input pulse 0) will reset the following flip flop $FF_2$ through $II_1$ and $S_{1A}$. As a result, when the input pulse is low the delay block $DL_1$ will be reset and $OUT_1$ becomes 0. Once the input pulse IP becomes high (1), then the logic diagram of FIG. 11 creates delays as described for the logic diagram of FIG. 9.

Figure 12:
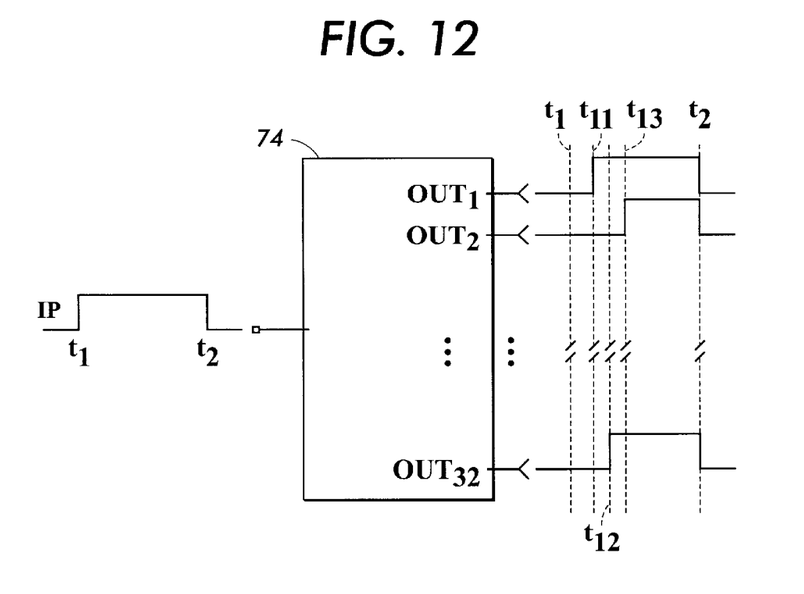
FIG. 12 shows how the delay logic of FIG. 6 provides pulse width modulation.

Referring to FIG. 12, when an input pulse IP with a rising edge at $t_1$ and a falling edge at $t_2$ is sent to the PWM block logic 74 of FIG. 6, each output will delay the rising edge of the same input pulse IP with a different delay value. Therefore, Output lines $OUT_1$, $OUT_2$ and $OUT_{32}$ delay the rising edge of IP and send it out at $t_{11}$, $t_{13}$, and $t_{12}$ respectively. However, when the falling edge of the input pulse IP at $t_2$ enters PWM block 74, all the outputs $OUT_1$, $OUT_2$ and $OUT_{32}$ will become 0. It should be noted that each output $OUT_1$–$OUT_{32}$ can have a different delay and therefore each output can have less or more delay than what is shown. The PWM block 74 provides pulse width modulation since each output $OUT_1$–$OUT_{32}$ sends out a signal with a rising edge that has a different timing, but a falling edge concurrent with the falling edge of the signals of the other outputs OUT$_1$–OUT$_{32}$. As a result, the width of each output pulse is determined by its respective delay value V$_1$–V$_{32}$.

The logic diagram of FIG. 6 is designed to create 0–64T delays for each signal of 32 lines. However, the concept of this invention can be applied to different number of delays on different number of lines.

Figure 13:
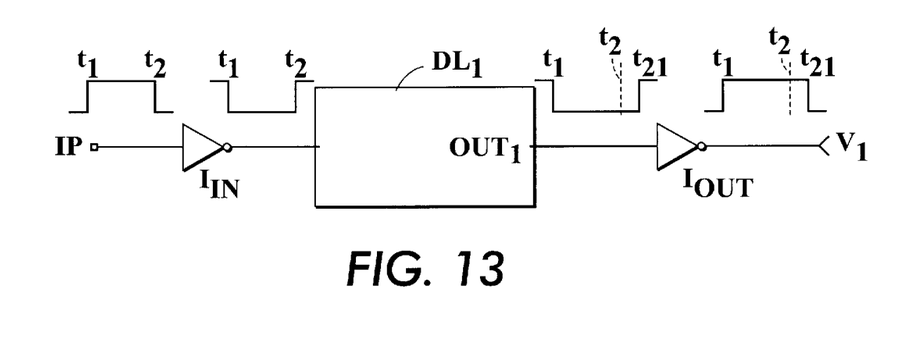
FIG. 13 shows an alternative pulse width modulation through delaying the opposite edge of the input pulse.

Referring to FIG. 13, there is shown an alternative pulse width modulation of this invention. In FIG. 13, the input pulse IP is inverted through inverter I$_{IN}$ before applying to block DL$_1$ and the output OUT$_1$ of DL$_1$ is connected to inverter I$_{OUT}$. In FIG. 13, the rising edge of the input pulse IP at t$_1$ will reset the DL$_1$ block and the falling edge of the input pulse t$_2$ will be delayed. Therefore, I$_{OUT}$ sends out a signal with a rising edge at t$_2$ and a falling edge at t$_{21}$ (the delayed falling edge of the input pulse IP). If this inversion is applied to all blocks DL$_1$–DL$_{32}$ of FIG. 6, they will provide pulse width modulation by concurrently sending out the rising edge of the input pulse and delaying the falling edge of the input pulse IP according to their respective delay values V$_1$–V$_{32}$.

It should also be noted that numerous changes in details of construction and the combination and arrangement of elements may be resorted to without departing from the true spirit and scope of the invention as hereinafter claimed.

What is claimed is:

1. An apparatus for pulse width modulation comprising:

a delaying means;

said delaying means receiving a pulse and creating a plurality of modulated pulses;

said pulse having a first pulse edge and a second pulse edge;

a lookup table for storing an individual delay data for each of said plurality of modulated pulses;

said delaying means being in a communication with said lookup table for receiving said delay data;

said delaying means being responsive to said delay data from said lookup table to delay only said first pulse edge of said pulse according to each of said individual delay data to create a plurality of delayed first pulse edges; and said delaying means sending out each of said plurality of delayed first pulse edges in a combination with said received second pulse edge of said pulse as the first pulse edge and second pulse edge of a modulated pulse to create said plurality of modulated pulses with different pulse widths.

2. The apparatus for pulse width modulation as recited in claim 1, wherein said delaying means further comprising:

a plurality of storage means being in a communication with said lookup table;

each of said plurality of storage means receiving and storing a delay data for one of said plurality of modulated pulses;

a plurality of delaying blocks each being in a communication with one of said plurality of storage means for receiving said individual delay data; and each of said plurality of delaying blocks receiving said pulse and delaying the first pulse edge of said pulse according to said individual delay data.

3. The method of pulse width modulation recited in claim 1, wherein the first pulse edge is a rising edge and the second pulse edge is a falling edge.

4. The method of pulse width modulation recited in claim 1, wherein the first pulse edge is a falling edge and the second pulse edge a rising edge.

5. A pulse width modulation apparatus for correcting non-uniformity of droplet size or droplet ejection velocity of an acoustic inkjet printhead by creating, an individual control signal for each transducer, the pulse width modulation apparatus comprising:

a delaying means;

said delaying means receiving a pulse and creating a plurality of control pulses;

said pulse having a first pulse edge and a second pulse edge;

a lookup table for storing an individual delay data for each of said plurality of control pulses;

said delaying means being in a communication with said lookup table for receiving said individual delay data;

said delaying means being responsive to said delay data from said lookup table to delay only said first pulse edge of said pulse according to each of said individual delay data to create a plurality of delayed first pulse edges; and said delaying means sending out each of said plurality of delayed first pulse edges in a combination with said received second pulse edge of said pulse as the first pulse edge and second pulse edge of a control pulse to create a plurality of control pulses with different pulse widths.

6. The pulse width modulation apparatus as recited in claim 5, wherein said delaying means further comprising:

a plurality of storage means being in a communication with said lookup table;

each of said plurality of storage means receiving and storing an individual delay data for one of said plurality of control pulses;

a plurality of delaying blocks each being in a communication with one of said plurality of storage means for receiving said individual delay data; and each of said plurality of delaying blocks receiving said pulse and delaying the first pulse edge of said pulse according to said individual delay data.

7. The method recited in claim 6, wherein said individual delay data is data for correcting droplet ejection velocity.

8. The method of pulse width modulation recited in claim 5, wherein the first pulse edge is a rising edge and the second pulse edge is a falling edge.

9. The method of pulse width modulation recited in claim 5, wherein the first pulse edge is a falling edge and the second pulse edge a rising edge.

10. The method recited in claim 5, wherein said individual delay data is data for correcting droplet size.

* * * * *